United States Patent [19]

Koo

[11] 4,012,757
[45] Mar. 15, 1977

[54] CONTACTLESS RANDOM-ACCESS MEMORY CELL AND CELL PAIR

[75] Inventor: James T. Koo, Sunnyvale, Calif.

[73] Assignee: Intel Corporation, Santa Clara, Calif.

[22] Filed: May 5, 1975

[21] Appl. No.: 575,034

[52] U.S. Cl. .................. 357/24; 307/238; 340/173 CA; 357/23; 357/41; 357/59; 357/71

[51] Int. Cl.² .................. H01L 27/10

[58] Field of Search .................. 357/24, 23, 41; 307/238; 340/173 CA

[56] References Cited

UNITED STATES PATENTS

| 3,720,922 | 3/1973 | Kosonocky | 357/24 |
|---|---|---|---|
| 3,810,125 | 5/1974 | Stein | 357/24 |

OTHER PUBLICATIONS

Boll et al., IEEE J. Solid State Circuits, vol. SC8, No. 5, Oct. 1973, p. 314.

*Primary Examiner*—William D. Larkins
*Attorney, Agent, or Firm*—Spensley, Horn & Lubitz

[57] ABSTRACT

A one device per bit random access memory cell and array is constructed with integrated circuit MOSFET transistors as the memory cell switching elements. Information transfer is accomplished by transferring incremental charges between a capacitor to a sense bit line. The capacitor is comprised of a region disposed in the substrate and a constantly charged polycrystalline plate insulatively disposed above the semiconductor substrate. The MOSFETS have a merged sense line and source region and have omitted a separate diffusion for their drain region by merging the drain with the capacitor region. The storage devices are grouped in pairs and share a common gate member and a common capacitive plate. Therefore, a single contact window is provided to the common gate member and the use of one half of the minimum contact area is allocated per device. By means of an interdigitated topology, a memory cell pair is devised having a small field area with a relatively large cell to bit line capacitance ratio.

4 Claims, 7 Drawing Figures

CONTACTLESS RANDOM-ACCESS MEMORY CELL AND CELL PAIR

BACKGROUND OF THE INVENTION

1. Field of the Invention

The present invention relates to the field of random-access memories (RAM) utilizing integrated circuitry. More particularly, the present invention relates to large, high density, random access memories utilizing a single device per storage cell.

2. Description of the Prior Art

Random access memories using a single device per bit, based on the use of a metal oxide silicon field effect transistor, are well known to the art. Informational charge increments are transferred between the capacitance of an addressed memory cell or storage device to the bit line capacitance. Reading, writing and refreshing is performed by conventional means. The array of memory devices is typically organized as a two dimensional matrix of rows and columns. Each row is coupled to the gates of the integrated circuit's MOSFETs which comprise that row. In the same manner, each column is coupled to the source regions of the MOSFETs which comprise that column. The drains in turn of each of the devices is usually capacitively coupled to ground. In some prior art, a merged sense line and source region serves as the columns of the array. A diffusion region is then provided for the drain of each device and is extended to form one of the capacitor plates disposed within the semiconductor surface. Alternatively, the diffusion region may be coupled to appropriate metallization to form one of the capacitor plates disposed above a corresponding capacitive diffusion region in the semiconductor substrate. See, U.S. Pat. No. 3,387,286 (1968). The performance of the storage device depends in large part on the ratio of the capacitance of the storage device to the capacitance of the sense or bit line. In order to maximize this ratio, the prior art has devised various means to increase the capacitance of the device. For example, this ratio has been increased by using the capacitance between an isolated diffusion region and the grounded substrate in which the diffusion region is formed. The capacitance of such an isolated diffusion region may also be increased by disposing a grounded, conductive line insulatively spaced above the isolated diffusion region. See U.S. Pat. No. 3,387,286 (1968).

Both of the above mentioned prior art means for providing a large cell capacitance to bit line capacitance ratio require relatively large amounts of chip area. To offset this, in the prior art the storage devices are grouped in pairs and cross connected, that is the grounded capacitive plate of a first device is coupled to the gate of a second device which is always maintained in the complementary state. Thus, a fixed potential line may be eliminated without decreasing the ratio of cell capacitance to line capacitance.

However, in each of the prior art devices discussed above as the overall cell size is decreased, the ratio of cell capacitance to bit line capacitance also significantly decreases. Therefore, the overall minimum size of each memory cell was limited by the minimum acceptable memory cell capacitance ratio.

For other relevant prior art see IBM Technical Disclosure Bulletin Vol. 15, No. 6, November 1972.

SUMMARY OF THE INVENTION

The present invention is an integrated circuit memory formed in semiconductor substrate which has a multiplicity of memory cells. Each cell is coupled to at least one of a a plurality of word select lines of the memory circuit. Similarly, each cell is also coupled to one of a plurality of sense lines of the memory circuit. Each memory cell is comprised of a first conductive means in a first region of the semiconductor substrate. The first conductive means forms the sense line of the memory cell. A second conductive means is insulatively disposed over the semiconductor substrate, namely over a second region of the substrate which is substantially contiguous to the first conductive means. The second conductive means is employed as a gate electrode to control electrical current flowing in the second region. Finally a third conductive means is insulatively disposed over the semiconductor substrate over a third region which is substantially contiguous to the second region but not to the first region. The third conductive means functions as a capacitive plate for storing electrical charge. Voltage is applied to the third conductive means to cause the underlying third region to become conductive by virtue of being in an invention mode. Finally there is a means for maintaining the third conductive means at a fixed potential so that the third conductive means and third region form a storage device.

Each of the above described memory cells are combined in pairs in an interdigitated topology whereby the field devoted to each memory cell pair is minimized without substantially decreasing the ratio of memory cell capacitance to sense line capacitance.

DESCRIPTION OF THE PREFERRED EMBODIMENTS

The present invention is an integrated memory circuit using a single element storage device to store an information bit. The storage device comprises a field effect transistor coupled to a capacitor which capacitor has its other terminal coupled to ground or a fixed potential. The field effect transistor portion of the storage device has a merged sense line and source region, and a merged drain and capacitor region. The merged drain and capacitor region is formed by a potential applied to a conductive electrode insulatively disposed above the semiconductive substrate. The electric field from the electrode induces an inversion region in the underlying semiconductor surface. A second conductive electrode is insulatively disposed above a transmission region in a semiconductor substrate, which region is contiguous both to the merged source and sense line region, and the merged drain and capacitor region. Thus, the charge coupled device is formed of three regions and three electrodes, namely: (1) a first electrode being a first region which is a first diffusion region disposed with the semiconductor substrate; (2) a second electrode being a conductive member insulatively disposed above a second region in the semiconductor substrate, which region forms the transmission region of the field effect transistor portion of the storage device; and (3) a third electrode being a conductive member insulatively disposed above a third region in the semiconductor substrate which region forms the merged drain and one of the capacitor plates of the capacitive element of the storage device. Each storage device forms a finger-like projection from its sense bit line and is arranged in an interdigitated pattern. The interdigitation of the storage devices permits the deployment of a single, integral gate electrode and of a single, integral capacitive electrode, which form the second and third electrodes respectively of the storage device. The present invention will be better understood by referring to FIGS. 1-7.

It is to be understood throughout this specification that whether a region is a source or drain depends on the conductivity type of the substrate and the polarity of the applied potential. Therefore, the terms, "source" and "drain" are used generally to denote any appropriate source or drain region in a field effect transistor. It is also to be understood throughout this specification that wherever the term "semiconductor substrate", is used, it is to be construed generally to include, for example, a thick monocrystalline layer of silicon, an epitaxial layer of silicon grown on a supporting base, or a monocrystalline layer grown on an oxide layer which in turn is supported by a thick spinel or sapphire base.

Figure 1:
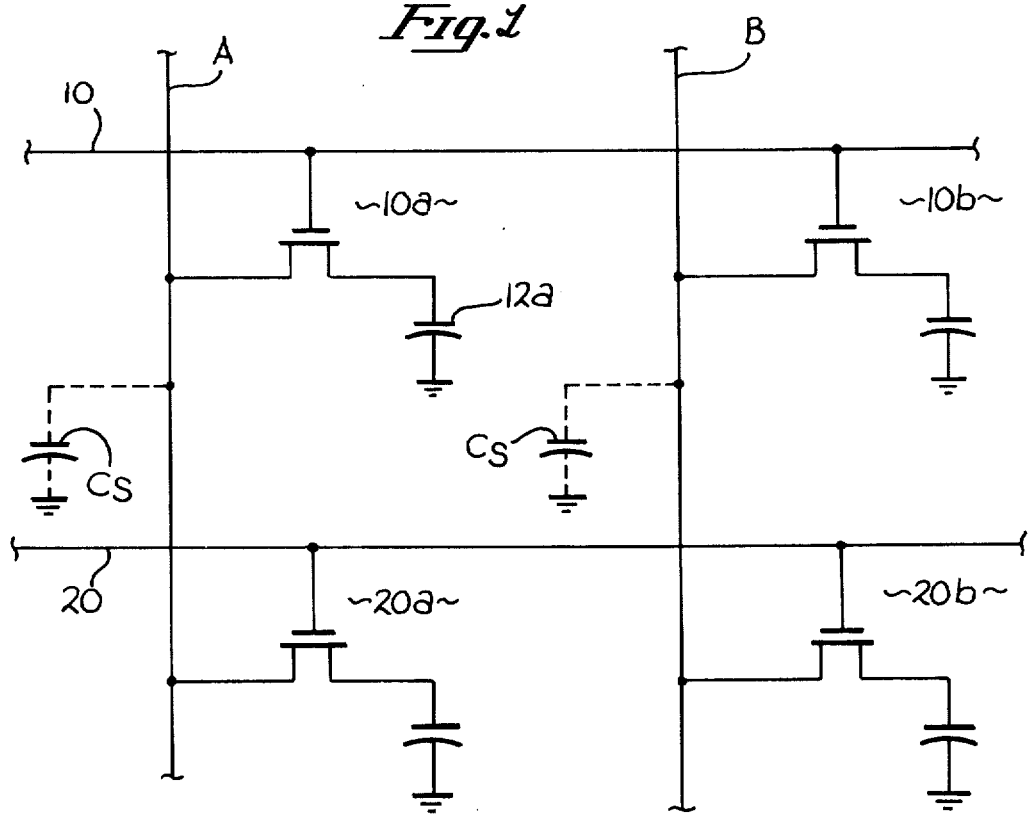
FIG. 1 is a general schematic of a portion of a memory array applicable both to the prior art and to the presently invented memory.

In particular, FIG. 1 illustrates a portion of the memory array, well known to the art, wherein a single storage device is used to store an informational bit. For the purposes of simplification, four such storage devices or memory cells 10a and 10b, and 20a and 20b, are shown. The sources of storage devices or memory cells 10a and 20b are coupled to sense line A. In the same manner the sources of cells 10b and 20b are coupled to sense line B. The gates of cells 10a and 10b are coupled to word select line 10, while the gates of cells 20a and 20b are coupled to word select line 20. At the beginning of a read operation all the sense lines, such as lines A and B, are in a discharged state or alternatively may be fixed at a certain potential, i.e. + 10 volts.

Assume capacitors 12a and 22b are charged, while capacitors 22a and 12b are discharged. A read command signal on word select line 10 will cause cells 10a and 10b to become conductive. A charge pulse or "one" (from capacitor 12a) will be read onto sense bit line A while line B will remain discharged. Appropriate decoders and buffer circuitry will couple the information read onto sense line A to a data output pin, and at the end of the read cycle, reinsert the information into cell 10a by applying a charge to sense line A while word select line 10 remains energized. In the same fashion the bit may be read from cell 20b by applying a read command signal to word select line 20.

It will be appreciated that in an actual integrated circuit array, a stray capacitance is associated with each sense line. For example, the signal strength read onto sense line A from cell 10a will largely be determined by the ratio of the capacitance of capacitor 12a with respect to capacitor, Cs (which is primarily parasitic). Also as memory density increases, the area allocated to capacitors 12a and 12b, and 22a and 22b, decreases. Thus, for more economical, higher density memories the ratio of the capacitance of the memory cell to the capacitance of the sense lines decreases.

The storage devices of the present invention are grouped in memory cell pairs such that the ratio of the capacitance of each storage device to the stray capacitance of its corresponding bit line may be maintained at a high value even though the area alloted to each storage device is substantially reduced. For example, a ratio of storage device to bit line capacitance of approximately 4.5 may be maintained by storage devices constructed according to the present invention with a field area of approximately 0.786 square mil.

Figure 2:
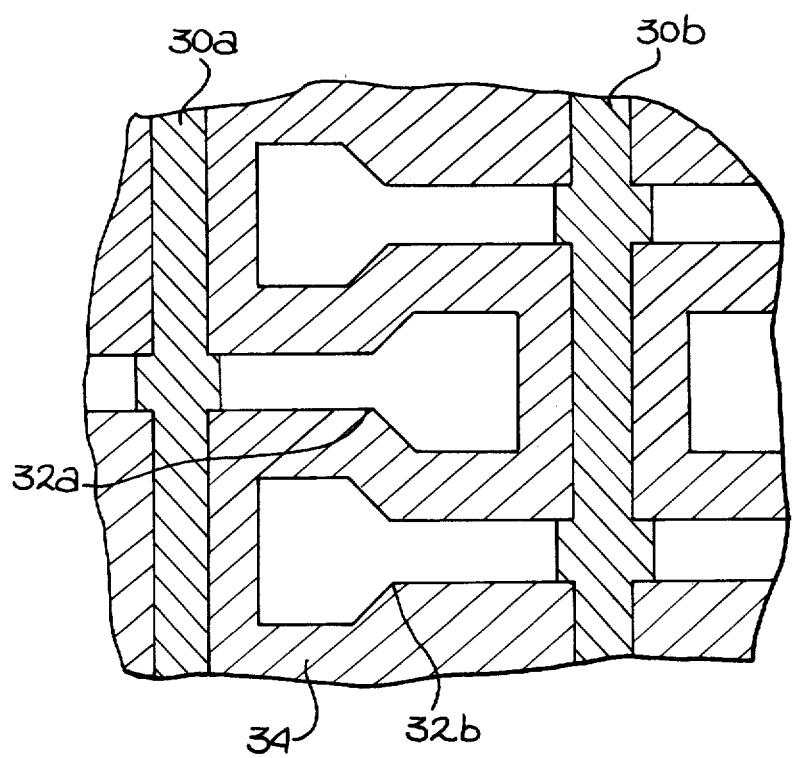
FIG. 2 is a plan view of a memory cell pair taken through section line 2—2 of FIG. 5, showing two interdigitated finger-like projections and two parallel diffusion sense lines in a substrate.

In FIG. 2 a semiconductor substrate is divided into three areas, as follows: (1) merged sense line and source regions disposed into the semiconductor substrate in a predetermined pattern (lines 30a and 30b); (a) finger-like projections 32a and 32b extending in a generally perpendicular manner from its corresponding sense bit line 30a or 30b; and (3) a complementary field 34 which is disposed between lines 30a and 30b, and projections 32a and 32b. In the presently preferred embodiment the semiconductor substrate is p-doped monocrystalline silicon. Sense lines 30a and 30b are n-type regions disposed within the upper portion of the semiconductor substrate by means well known to the art. Sense lines 30a and 30b are substantially parallel and form the columns of the memory array. Finger-like projections 32a and 32b are essentially defined by the complementary field 34. Complementary field 34 is formed by heavily doping the semiconductor substrate with a p-type dopant. Thus, finger-like projections 32a and 32b are essentially electrically isolated one from the other by the stop diffusion region provided by complementary field 34. As will subsequently be seen, each storage device comprises a first region which is sense bit line 30a and 30b, a second region which is transmission region 36a or 36b, and a third region which is capacitor region 38a or 38b. Therefore, in the preferred embodiment each storage device is based upon an n-type doped sense line and merged source line 30a which is contiguous to a p-type doped finger-like projection 32a, which in turn is surrounded by a heavily p-typed complementary field or stop diffusion field 34.

Figure 3:
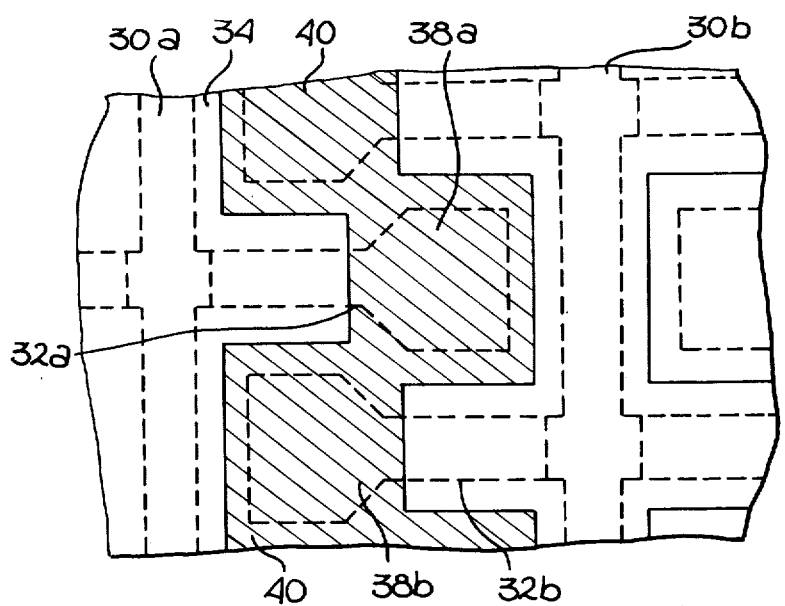
FIG. 3 is a plan view of the structure of FIG. 2 taken through section line 3—3 of FIG. 5 showing the capacitively coupled region disposed over the substrate.

FIG. 3 illustrates the next element of the memory cell pair. Sense lines 30a and 30b and finger-like projections 32a and 32b are illustrated in FIG. 3 with a dotted outline. The added element, is a conductive member 40 which is insulatively spaced over the semiconductor substrate and extends between parallel sense lines 30a and 30b. Conductive member 40 is selectively disposed over the interdigitated pattern formed by the underlying finger-like projections 32a and 32b so that it substantially overlies capacitor regions 38a and 38b. In one embodiment of the present invention conductive member 40 is a doped polycrystalline silicon layer which is disposed upon silicon oxide, which in turn is disposed over the underlying diffusion patterns defined in the semiconductor substrate. Conductive member 40 also extends to similar memory cell pairs located between sense lines 30a and 30b. At the end of the column or at some other appropriate location, conductive member 40 is electrically coupled to the positive supply voltage of the integrated circuit. The maintenance of a constant potential on conductive member 40 with respect to the semiconductor substrate causes capacitor regions 38a and 38b to be in the inversion mode. Thus, conductive member 40 serves as a common capacitive plate while each capacitor region 38a and 38b forms the second capacitor plate and drain of each corresponding storage device.

Figure 4:
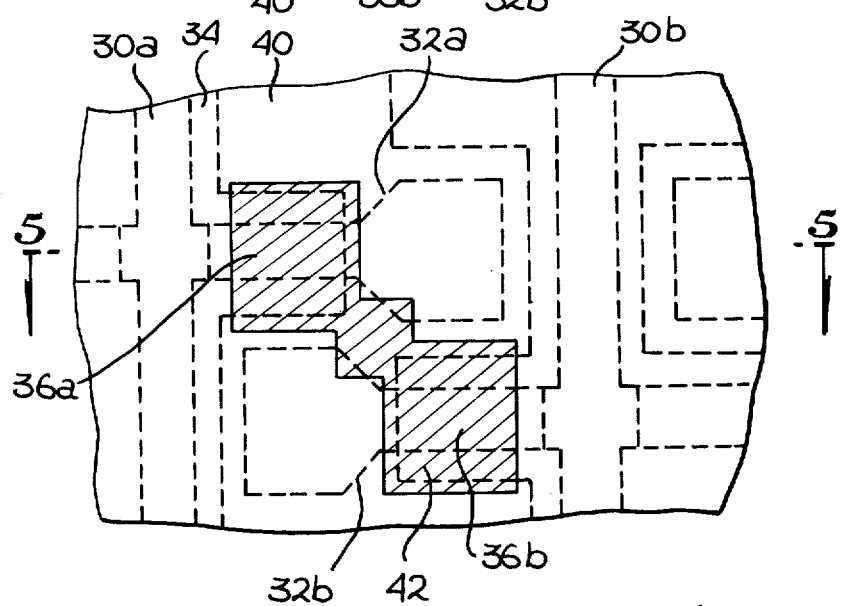
FIG. 4 is a plan view of the topological layout of FIG. 3 taken along section 4—4 of FIG. 5 showing a single integral member forming the gate electrode of a memory cell pair disposed over the underlying layers.

FIG. 4 is a plan view showing sense lines 30a and 30b, finger-like projections 32a and 32b and conductive member 40 in dotted outline. A second conductive member 42 is added and is insulatively disposed over the semiconductor substrate and conductive member 40. Conductive member 42 serves as a gate electrode for the memory cell pair. A portion of conductive member 42 is insulatively disposed over transmission region 36a and 36b of finger-like projections 32a and 32b. Wherever conductive member 42 overlaps conductive member 40, conductive member 42 is insulatively disposed over conductive member 40. In one embodiment of the present invention, conductive member 42 is a doped polycrystalline layer formed in the shape of three connected and overlying squares. Conductive member 42 is disposed on two levels, one overlaying transmission region 36a and 36b, and the other overlying conductive member 40.

Figure 5:
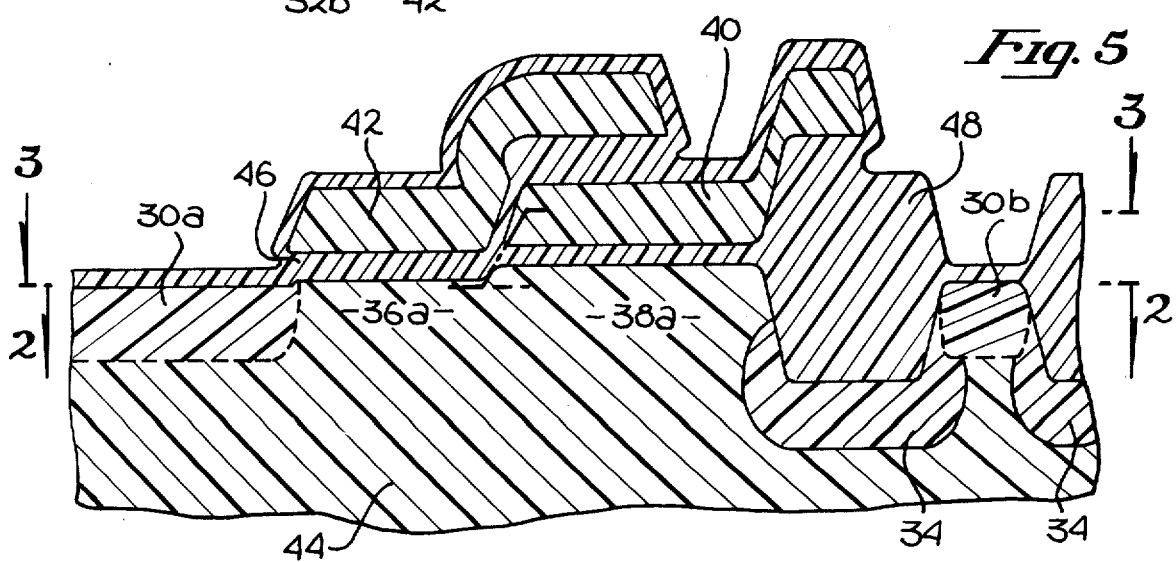
FIG. 5 is a cross section of one memory cell of the memory cell pair illustrated in FIG. 4 taken through the line 5—5.

The operation of the storage device and the disposition of the various elements may be better understood by viewing FIG. 5. FIG. 5 is a cross section of the device illustrated in FIG. 4 taken through lines 5—5. FIG. 5 shows sense lines 30a as diffused into an upper portion of semiconductor substrate 44. Sense line 30a extends to form the merged source region of the field effect transistor portion of the storage device. A transmission region 36a is contiguous to sense bit line and merged source region 30a. In the same manner a capacitor region 38a is contiguous to transmission region 36a. Insulatively disposed above transmission region 36a is conductive member 42 which serves as a gate electrode, while conductive member 40 is insulatively disposed above capacitor region 38a. A constant potential maintained on conductive member 40 maintains capacitor region 38a in the inversion mode. Thus, capacitor region 38a serves as a merged drain region and capacitor plate for the storage device formed by finger-like projection 32a. Where conductive member 42 and conductive member 40 overlap, conductive member 42 is insulatively spaced above conductive member 40. In the same manner where conductive member 40 overlaps complementary diffusion region 34, conductive member 40 is insulatively spaced over complementary region 34 by a thick insulating layer 48.

In the embodiment in which semiconductor substrate 44 is silicon, insulative layer 46 and 48 are of silicon oxide. It may be appreciated that the operation of the storage device formed by finger-like projection 32a depends in part upon the conductivity of capacitor region 38a. For this purpose it may be desirable to space conductive member 40 somewhat more closely to the surface of semiconductor substrate 44 than is the case with conductive member 42. In one embodiment, conductive member 40 is positioned closer to the surface of semiconductor substrate 44 by means of an differential step in the substrate's surface. Such a differential may be formed by etching or any other process well known to the art. It is also possible that a differential spacing may be created by selectively forming the intervening thickness of insulating layer 46.

Figure 6:
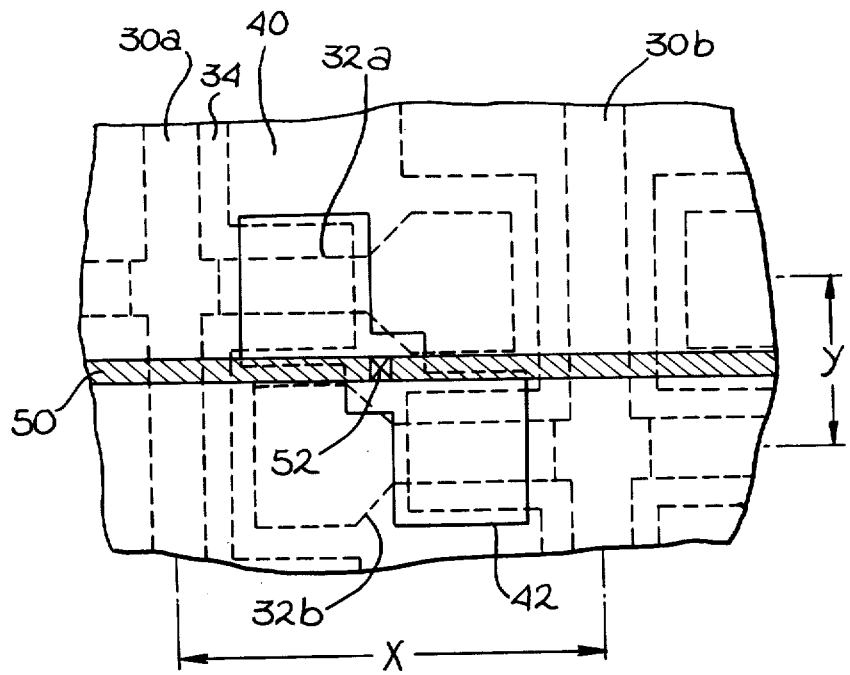
FIG. 6 is a plan view of the memory cell pair illustrated in FIG. 4 after the formation of a contact window shared between the cells of the memory cell pair and after the deposition of a word or select line.

FIG. 6 is a plan view of the memory cell pair showing sense lines 30a and 30b, finger-like projections 32a and 32b, and conductive member 40 in dotted outline. A contact pad or window 52 is disposed in the insulative oxide layer formed over conductive member 42. It may be appreciated that conductive member 42 serves as a common gate electrode for the storage devices formed by finger-like projection 32a and 32b. Therefore, a window 52 may be made with the smallest possible dimensions as determined by the resolution limits of ordinary photolithographic techniques. Thus, the gate electrode of each cell illustrated in FIG. 1 shares one half of the possible minimum area for a contact window. After the formation of contact window 52, a line of metallization 50 may be disposed over the memory cell pairs and into contact window 52. In the same manner conductive member 42 may be electrically coupled to other circuitry on the semiconductor chip and to other memory cell pairs within the memory array.

Typically, a memory cell pair made according to the present invention may have a distance, $x$, between the center line of sense line 30a and the center line of sense line 30b, approximately 30–35 microns. Likewise, the distance, $y$, between the center line of finger-like projection 32a and the center line of finger-like projection 32b, may be approximately 13 microns. Therefore, the memory cell pair size may be as small as approximately 500 microns square. A random access memory having a 16,384 bit capacity may thus be fabricated using the memory cell of the present invention on a chip size of approximately 185 mils on a side.

Figure 7:
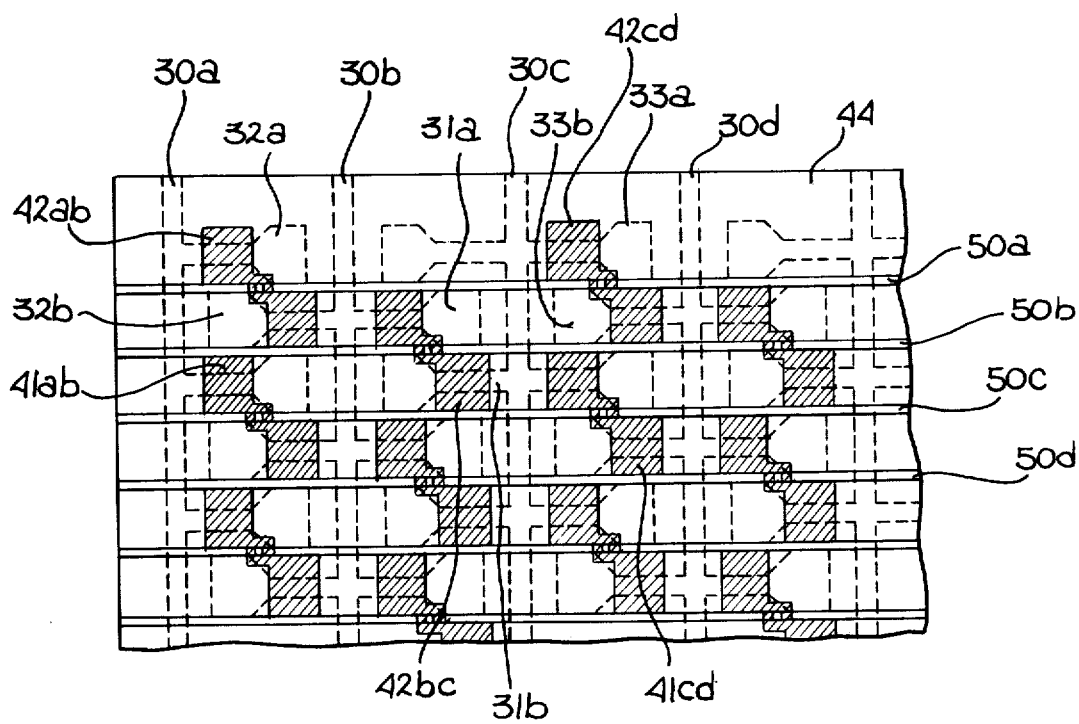
FIG. 7 is a plan view of a portion of the memory array according to the present invention showing the interdigitated pattern of multiple sense bit lines and memory cell pairs and the connection of the word select lines to the various gate members of various memory cell pairs. The capacitive element has been omitted for the sake of clarity.

A memory array fabricated according to the present invention may be better visualized by viewing FIG. 7 which shows a plan view of a portion of such a memory array. Four sense lines 30a, 30b, 30c and 30d are illustrated as disposed in semiconductor substrate 44. Finger-like projections 32a and 32b form a first memory cell pair having a conductive member 42ab as its gate electrode. For clarity and simplicity, other elements of the present invention, such as conductive member 40, have been omitted from the illustration. Likewise, finger-like projections 31a and 31b, together with electrode 42bc, and finger-like projections 33a and 33b, together with conductive member 42cd, form a second and third memory cell pair, respectively. Similar memory cell pairs are shown as coupled to conductive members 41ab and 41cd. Each gate electrode has a contact window in which one of the word select lines 50a, 50b or 50c is disposed. Thus, it can be easily seen that a memory cell pair between every other pair of sense lines will be connected to a common word select line 50a, 50b or 50c (the rows of FIG. 1). Likewise, the memory cell pairs located between adjacent pairs of sense lines will be coupled to one of two common sense lines, such as lines 30a, 30b, 30c or 30d, in an alternating interdigitated pattern. (The columns of FIG. 1.) Finally, the gate electrodes located between nonadjacent pairs of sense lines will be electrically coupled to a single word select line, such as conductive members 42ab and 42cd.

Therefore, by constructing storage devices according to the present invention and by combining such devices in memory cell pairs according to the topology disclosed, a high density memory cell array may be fabricated without decreasing the cell to sense line capacitance ratio. It is to be understood that further modifications and alterations may be made by those with ordinary skill in the art without departing from the spirit and scope of the present invention.

I claim:

1. An integrated circuit memory formed in a semiconductor substrate having a multiplicity of memory cell pairs, each memory cell pair coupled to one of a plurality of word select lines of said memory and each memory pair coupled to two of a plurality of sense lines of said memory, each of said memory cell pairs comprises:
   a first conductive means disposed in said semiconductor substrate for forming a first sense line of said memory and a first region in said memory cell pair;
   a second conductive means disposed in said semiconductor substrate for forming a second sense line of said memory and a second region in said memory cell pair;
   a conductive gate means insulatively disposed at least in part above a first and second transmission region in said semiconductor substrate, said gate means for controlling electrical current flowing in said first and second transmission regions and having a single electrical contact region, said first transmission region being substantially contiguous and electrically coupled to said first conductive means and said second transmission region being substantially contiguous and electrically coupled to said second conductive means; and
   a conductive capacitative means insulatively disposed at least in part above a first and second capacitor region in said semiconductor substrate, said capacitative means operable for storing electrical charge and for inducing said first and second capacitor region into a conductive state, said first capacitor region being substantially contiguous and electrically coupled to said first transmission and said second capacitor region being substantially contiguous and electrically coupled to said second transmission region, wherein:
   said first and second conductive means are diffusion regions disposed in said semiconductor substrate in substantially parallel channels;
   said first transmission and first capacitor regions form a first finger-like projection substantially perpendicular to said first conductive means; and
   said second transmission and second capacitor regions form a second finger-like projection substantially perpendicular to said second conductive means, said first and second finger-like projections forming an interdigitated pattern between said first and second conductive means.

2. The integrated circuit memory of claim 1 wherein:
   said conductive gate means is of doped polycrystalline silicon;
   said conductive capacitance means is of doped polycrystalline silicon and extends as an integral member to other memory cell pairs coupled to said first and second conductive means;
   said semiconductor substrate is of p-type doped monocrystalline semiconductor; and
   said first and second conductive means are n-type doped diffusion regions.

3. An integrated circuit memory formed in a doped semiconductor substrate having a multiplicity of memory cells wherein each of said memory cells is coupled to at least one of a plurality of word select lines of said memory and each of said memory cells is coupled to at least one of a plurality of sense lines of said memory and wherein a first conductive means is disposed in a first region of said semiconductor substrate for forming said sense line of said memory, a second conductive means is insulatively disposed above said semiconductor substrate over a second region of said semiconductor substrate substantially contiguous to said first conductive means for controlling the flow of electrical current across said second region and a third conductive means is insulatively disposed above said semiconductor substrate over a third region of said semiconductor substrate, said third region being substantially contiguous to said second region, having the same conductivity type as said second region, and being noncontiguous to said first conductive means, said third conductive means being adapted to cause said third region to become substantially conductive, thereby enabling said third region to store electrical charge, comprising:
   a first memory cell formed in said semiconductor substrate and having said first, second, and third conductive means and first, second and third regions; and
   a second memory cell formed in said semiconductor substrate having another of said first, second, and third conductive means, and first, second and third regions, wherein:
   said first conductive means of said first and second memory cells are disposed into said first regions of said semiconductor substrate in substantially parallel channels;
   said second conductive means of said first and second memory cells form a firt integral member, said member having a single electrical contact region;
   said second and third regions of each of said first and second memory cells each form a finger-like projection disposed in a substantially perpendicular direction from said corresponding first conductive means, said finger-like projections of said first and second memory cells forming an alternating interdigitated pattern between said corresponding first conductive means of said first and second memory cells; and
   said third conductive means of said first and second memory cells form a second integral member disposed between said corresponding first conductive means of said first and second memory cell, said second integral member extending to other pairs of memory cells of said multiplicity of memory cells, said other pairs each having others of said second and third regions appropriately coupled to said corresponding first conductive means of said corresponding memory cells.

4. The integrated circuit memory of claim 3 further comprising means for maintaining said third conductive means at a fixed potential.

* * * * *